(12) United States Patent
Park et al.

(10) Patent No.: US 7,348,197 B2
(45) Date of Patent: Mar. 25, 2008

(54) LIQUID CRYSTAL DISPLAY DEVICE AND FABRICATION METHOD THEREOF

(75) Inventors: Yong In Park, Gyeonggi-Do (KR); Dea Yuu Lee, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 184 days.

(21) Appl. No.: 11/158,000

(22) Filed: Jun. 22, 2005

(65) Prior Publication Data

US 2006/0051886 A1    Mar. 9, 2006

(30) Foreign Application Priority Data

Sep. 9, 2004    (KR) .................. 10-2004-0072254

(51) Int. Cl.
  *H01L 21/00*    (2006.01)
(52) U.S. Cl. .................. 438/30; 257/59; 257/E21.413; 257/E21.414
(58) Field of Classification Search .................. 438/30, 438/48, 128, 149, 151, 161; 257/59, 257, 257/290, 72
See application file for complete search history.

(56) References Cited

U.S. PATENT DOCUMENTS

| | | | |
|---|---|---|---|
| 6,403,409 | B1 | 6/2002 | You |
| 6,617,203 | B2 | 9/2003 | Kim et al. |
| 2006/0050191 | A1* | 3/2006 | Park et al. .................. 349/42 |

FOREIGN PATENT DOCUMENTS

| | | |
|---|---|---|
| CN | 1224887 | 8/1999 |
| JP | 2002-043577 | 2/2002 |
| KR | 19970003717 A | 3/1997 |
| KR | 19970008589 A | 5/1997 |
| KR | 19970011966 A | 8/1997 |
| KR | 20000025565 A | 5/2000 |
| KR | 20000026894 A | 5/2000 |
| KR | 20000026895 A | 5/2000 |
| KR | 20000031451 A | 6/2000 |
| KR | 20000041223 A | 7/2000 |
| KR | 20000075031 A | 12/2000 |
| KR | 20010019665 A | 3/2001 |

(Continued)

*Primary Examiner*—Quoc Hoang
(74) *Attorney, Agent, or Firm*—McKenna Long & Aldridge LLP

(57) ABSTRACT

A method for fabricating a liquid crystal display device includes providing first and second substrates; forming an active layer on the first substrate, wherein the active layer includes a source region, a drain region, a channel region, and a storage region; forming a first insulation layer on the first substrate; forming a gate electrode, a gate line, a pixel electrode, and a storage line on the first substrate, wherein storage line overlaps the storage region; forming a second insulation layer on the first substrate; forming first and second contact holes through the first and second insulation layers, wherein the first and second contact holes expose respective ones of the source and drain regions; forming a pixel hole through the second insulation layer, wherein the pixel hole exposes the pixel electrode; forming a source electrode electrically connected to the source region through the first contact hole and a drain electrode electrically connected to the drain region through the second contact hole; and forming a liquid crystal layer between the first and second substrates.

21 Claims, 16 Drawing Sheets

FOREIGN PATENT DOCUMENTS

| | | |
|---|---|---|
| KR | 20010019668 A | 3/2001 |
| KR | 20010056037 A | 7/2001 |
| KR | 20010110917 A | 12/2001 |
| KR | 20020022258 A | 3/2002 |
| KR | 20020071061 A | 9/2002 |
| KR | 20020071062 A | 9/2002 |
| KR | 20020074897 A | 10/2002 |
| KR | 20020078116 A | 10/2002 |
| KR | 20020079196 A | 10/2002 |
| KR | 20020080202 A | 10/2002 |
| KR | 20030006619 A | 1/2003 |

* cited by examiner

LIQUID CRYSTAL DISPLAY DEVICE AND FABRICATION METHOD THEREOF

This application claims the benefit of Korean Patent Application No. P2004-72254, filed on Sep. 9, 2004, which is hereby incorporated by reference for all purposes as if fully set forth herein.

BACKGROUND OF THE INVENTION

1. Field of the Invention

The principles of the present invention generally relate to liquid crystal display (LCD) devices and their methods of fabrication. More particularly, the principles of the present invention relate to an LCD device having a storage capacitor and a simplified method of fabricating the same.

2. Discussion of the Related Art

As demand for information displays and applications for portable information devices increase, thin film type flat panel display (FPD) devices have been actively researched and developed. Of the various types of FPD devices, LCD devices are particularly beneficial as the LCD panels provided therein express images at high resolution and excellent color quality. Accordingly, LCD devices are often incorporated within notebook computers, desktop monitors, and the like.

LCD panels typically include a color filter substrate, an array substrate bonded to the color filter substrate, and a liquid crystal layer formed between the color filter and array substrates. The array substrate typically includes a plurality of switching devices (i.e., thin film transistors (TFT)) arranged in a matrix pattern. Each TFT generally includes a thin film of amorphous or polycrystalline silicon as an active pattern through which a channel is selectively defined.

FIG. 1 illustrates a partial plan view of a related art array substrate. It will be appreciated that the related art array substrate includes a plurality of pixels, each defined by a crossing of a plurality of gate lines and data lines. Thus, and for simplicity in illustration, only one pixel of the related art array substrate will be discussed with respect to FIG. 1.

Referring to FIG. 1, the array substrate 10 supports horizontally oriented gate lines 16 and vertically oriented data lines 17 defining a pixel region. A TFT is formed at the crossing of a gate line 16 and a corresponding data line 17 and a pixel electrode 18 is formed within each pixel region.

Each TFT includes a gate electrode 21 connected to the gate line 16, a source electrode 22 connected to the data line 17, a drain electrode 23 connected to the pixel electrode 18, and an active pattern 24 formed of polycrystalline silicon, through which a conductive channel region is defined between the source and drain electrodes 22 and 23 when a gate voltage is supplied to the gate electrode 21.

A pair of first contact holes 40A are formed through first and second insulation films (not shown) to enable electrical connection between the source electrode 22 and a source region of the active pattern 24 as well as between the drain electrode 23 and a drain region of the active pattern 24. A second contact hole 40B is formed through a third insulation film (not shown) to enable electrical connection between the drain electrode 23 and the pixel electrode 18.

Having described the array substrate above, a method of fabricating the related art array substrate according to a related art process will now be described in greater detail with reference to FIGS. 2A to 2F.

Referring to FIG. 2A, an active pattern 24 is formed by depositing a polycrystalline silicon thin film on a substrate 10 and, in a first photolithographic masking process, patterning the as-deposited thin film.

Referring to FIG. 2B, a first insulation film 15A and a conductive metal layer are sequentially deposited over the entire surface of the substrate 10 and on the active pattern 24. After being deposited, the conductive metal material is patterned in a second photolithographic masking process to form the gate electrode 21 over the active pattern 24 and separated therefrom by the first insulation film 15A.

Subsequently, p+ type or n+ type source/drain regions 24A/24B are formed at predetermined regions of the active pattern 24 by implanting impurity ions at a high density using the gate electrode 21 as a mask. Thus, the source/drain regions 24A/24B, separated by a channel region 24C, ohmically contact subsequently formed source/drain electrodes.

Referring to FIG. 2C, a second insulation film 15B is deposited over the entire surface of the substrate 10 and on the gate electrode 21. The first and second insulation films 15A and 15B are then patterned in a third photolithographic masking process removed to form a pair of first contact holes 40A that exposes portions of the source/drain regions 24A/24B.

Referring to FIG. 2D, a conductive metal material is then deposited over the entire surface of the substrate 10, within the pair of first contact holes 40A, and patterned in a fourth photolithographic masking process to simultaneously form the source and drain electrodes 22 and 23, each contacting the respective ones of the source and drain regions 24A and 24B via the pair of first contact holes 40A. As shown, a portion of the conductive metal layer is patterned so as to extend from the source electrode 22, thereby forming the data line 17.

Referring to FIG. 2E, a third insulation film 15C is deposited over the entire surface of the substrate 10 and is patterned in a fifth photolithographic process to form a second contact hole 40B, exposing a portion of the drain electrode 23.

Finally, and with reference to FIG. 2F, a transparent conductive metal material is deposited over the entire surface of the substrate 10, within the second contact hole 40B, and patterned in a sixth photolithographic masking process to form a pixel electrode 18 connected with the drain electrode 23.

As discussed above, the related art method of fabricating array substrate that incorporate polycrystalline silicon TFTs illustrated in FIG. 1 requires six photolithographic masking processes to form the active pattern 24, the gate electrode 21, the pair of first contact holes 40A, the source/drain electrodes 24A/24B, the second contact hole 40B, and the pixel electrode 18. It is generally known that a photolithographic mask process requires many sub-processes such as cleaning, photoresist deposition, exposure with expensive masks, developing, etching, stripping, inspection, etc. Thus, any method of fabricating array substrates that uses a large amount of photolithographic processes may result in a reduced production yield and increase the cost of fabrication.

SUMMARY OF THE INVENTION

Accordingly, the present invention is directed to an LCD device and method of fabricating the same that substantially obviates one or more of the problems due to limitations and disadvantages of the related art.

An advantage of the present invention provides an LCD device and a method of fabricating the same wherein the number of mask processes used to fabricate an array substrate is reduced.

Another advantage of the present invention provides an LCD device having a storage capacitor and a simplified method of fabricating the same.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating a liquid crystal display device may, for example, include providing a first substrate; forming an active layer on the first substrate, wherein the active layer includes a source region, a drain region, a channel region, and a storage region; forming a first insulation film on the first substrate; forming a gate electrode, a gate line, a pixel electrode, and a storage line on the substrate, wherein storage line overlaps the storage region; forming a second insulation layer on the first substrate; forming first and second contact holes through the first and second insulation layers, wherein the first and second contact holes expose respective ones of the source and drain regions; forming a pixel hole through the second insulation layer, wherein the pixel hole exposes the pixel electrode; forming a source electrode electrically connected to the source region through the first contact hole and a drain electrode electrically connected to the drain region through the second contact hole; bonding a second substrate to the first substrate; and providing a layer of liquid crystal between the first and second substrates.

In another aspect of the present invention, a liquid crystal display (LCD) device may, for example, include first and second substrates; an active layer formed as a silicon layer on the first substrate, the active layer having a storage region; a first insulation layer on the first substrate; a gate electrode and a gate line having first and second conductive layers; a storage line partially overlapping a the storage region; a pixel electrode having the first conductive layer; a second insulation layer opening the pixel electrode, the second insulation layer having first and second contact holes; a source electrode connected with a source region through the first contact hole and a drain electrode connected with a drain region through the second contact hole; and a liquid crystal layer between the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 1:
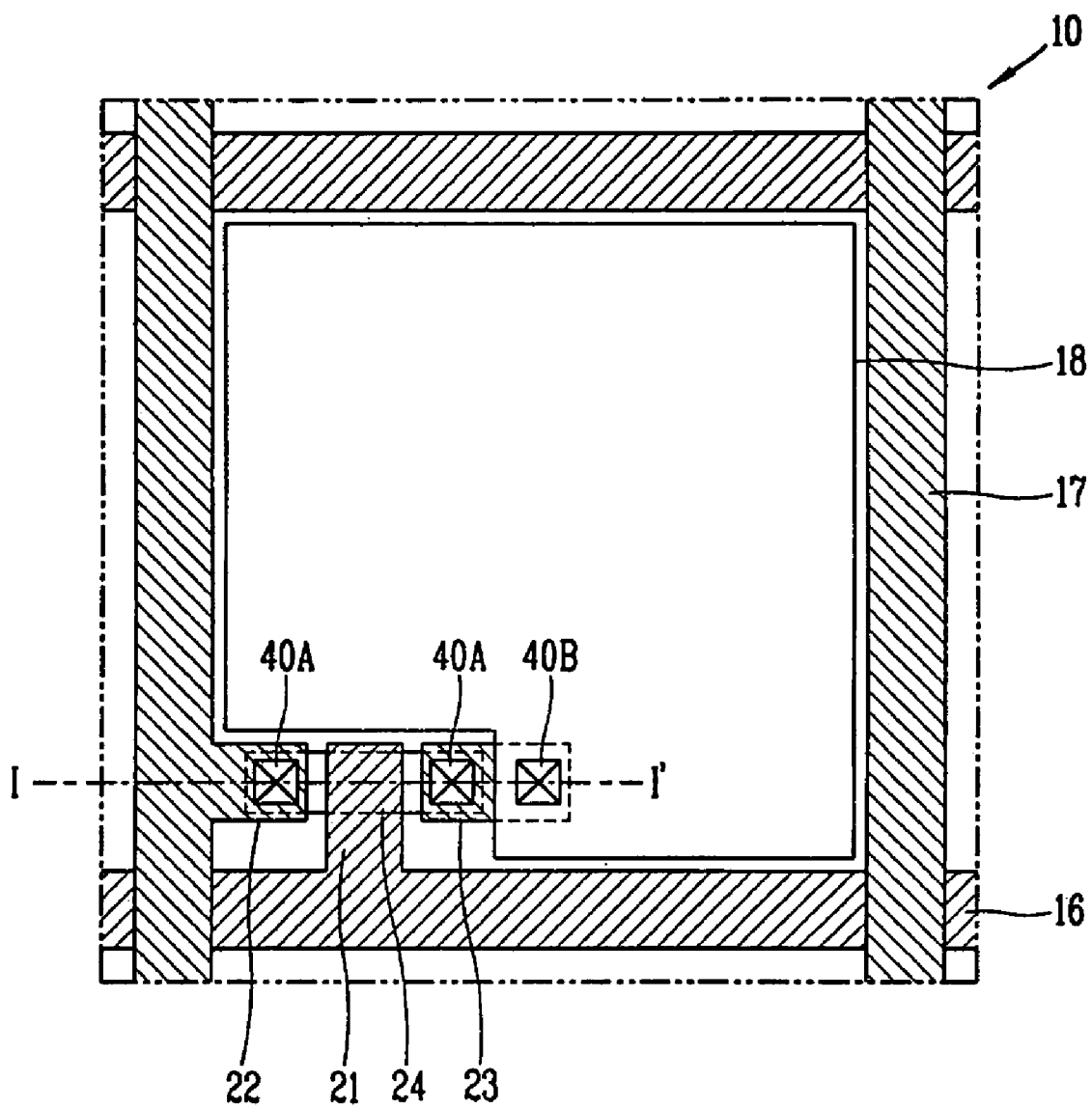
FIG. 1 illustrates a partial plan view of a related art array substrate.
Figure 2A:
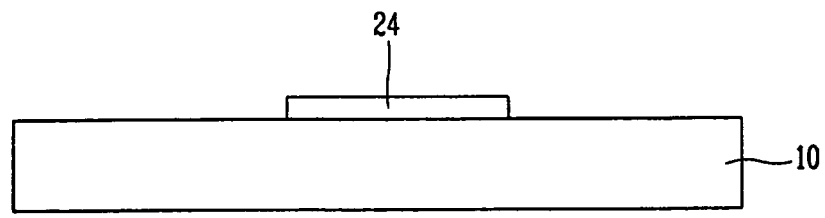
FIGS. 2A to 2F illustrate sectional views of a related art method of fabricating the array substrate shown in FIG. 1, taken along line I-I'.
Figure 2B:
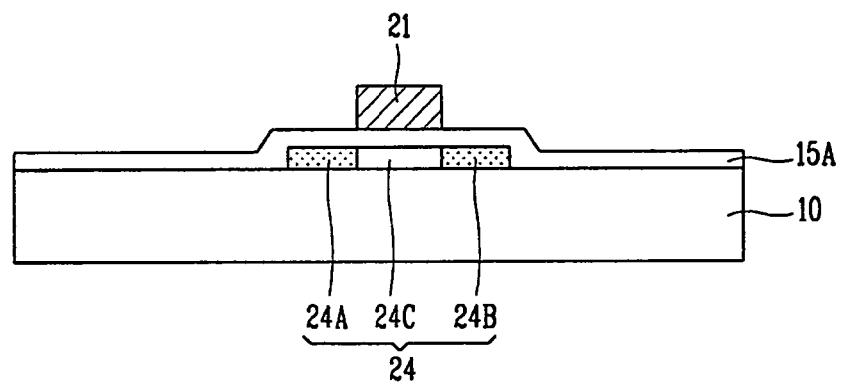
Figure 2C:
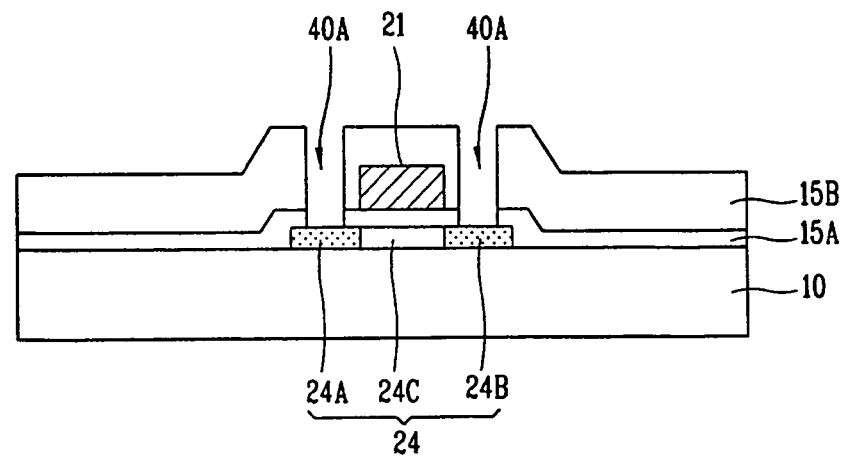
Figure 2D:
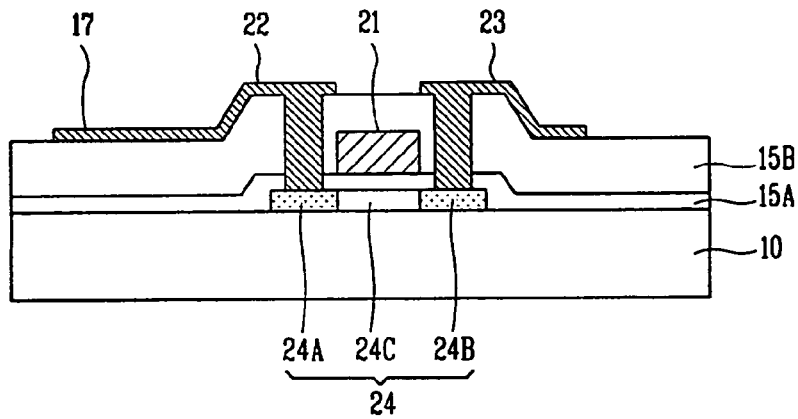
Figure 2E:
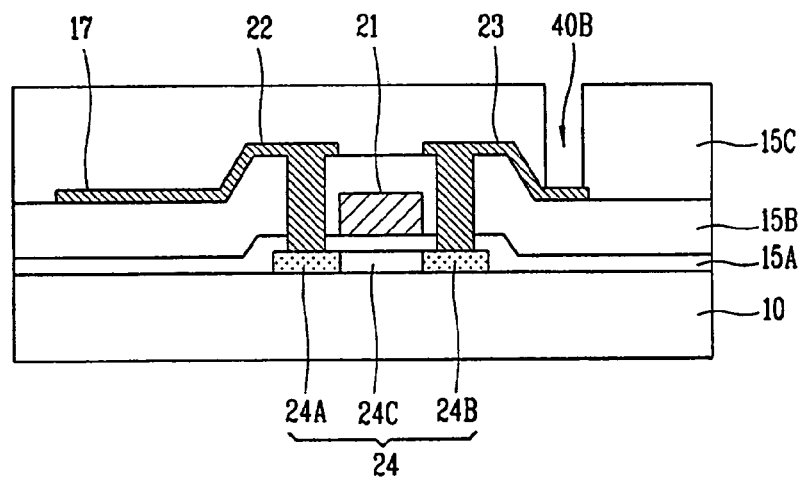
Figure 2F:
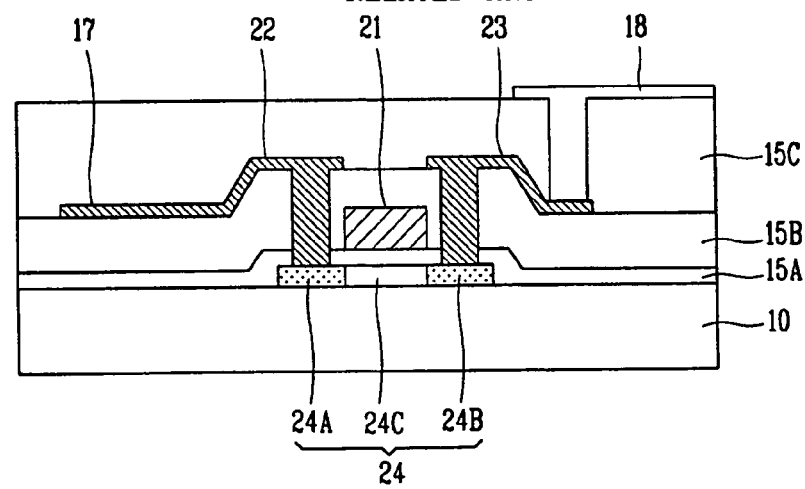
Figure 3:
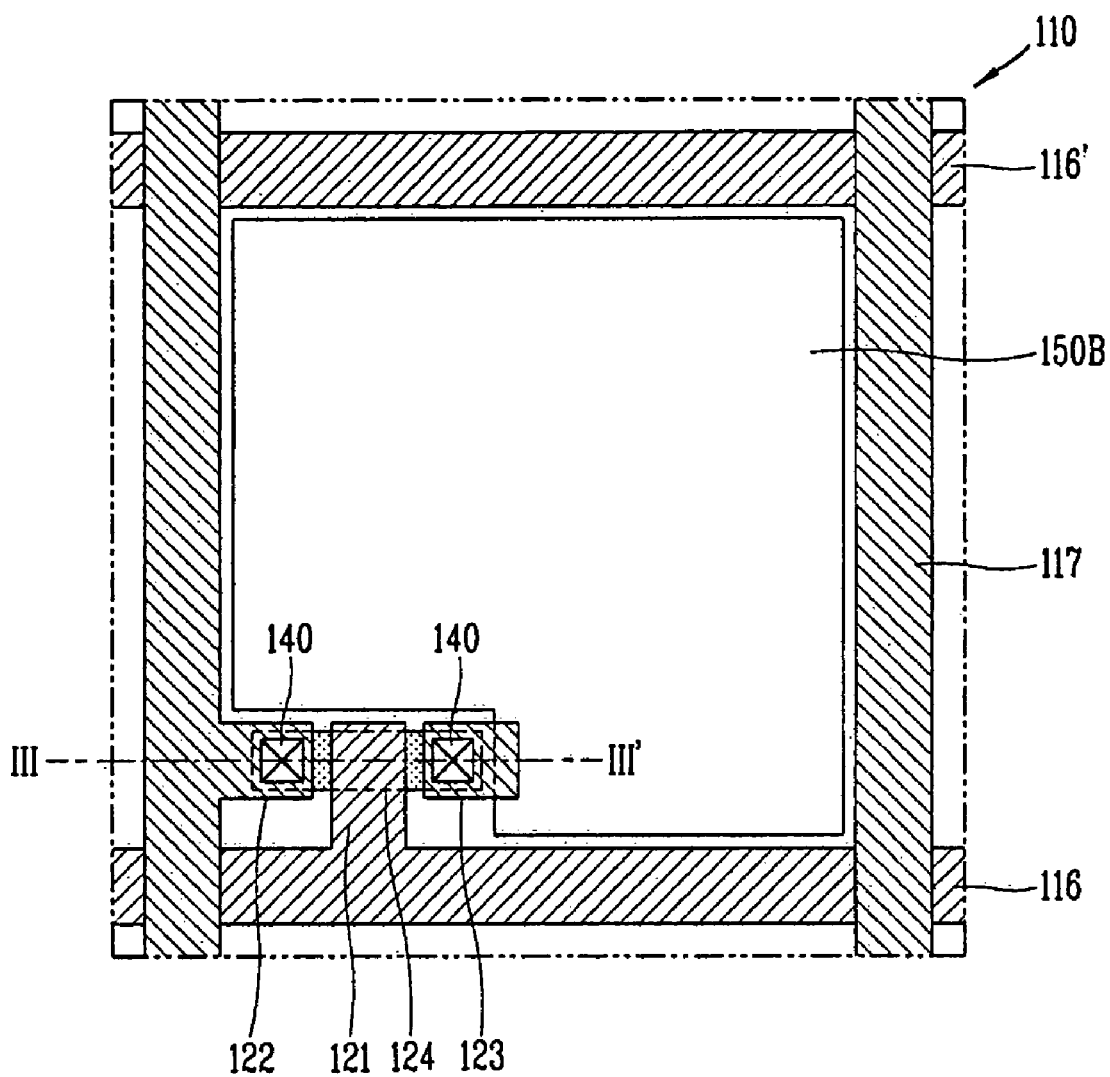
FIG. 3 illustrates a partial plan view of an array substrate according to principles of a first embodiment of the present invention.

FIG. 3 illustrates a partial plan view of a related art array substrate. It will be appreciated that the array substrate includes a plurality of pixels, each defined by a crossing of a plurality of gate lines and data lines. Thus, and for simplicity in description, only one pixel of the related art array substrate will be discussed with respect to FIG. 3.

Referring to FIG. 3, the array substrate 110 according to principles of the first embodiment of the present invention may, for example, support horizontally oriented gate lines 116 and 116' and vertically oriented data lines 117 defining a pixel region. According to principles of the present invention, and with respect to a particular pixel, reference numeral 116 designates the gate line that is connected to a corresponding TFT while reference numeral 116' designates a gate line that merely defines an edge of the pixel region. A switching device such as a TFT may be formed at the crossing of a gate line 116 and a corresponding data line 117 and a pixel electrode 150B may be formed within each pixel region. In one aspect of the present invention, each pixel electrode may be connected with a corresponding TFT and, in concert with a common electrode, may drive a layer of liquid crystal provided within the pixel region.

Each TFT may, for example, include a gate electrode 121 connected to the gate line 116, a source electrode 122 connected to the data line 117, a drain electrode 123 connected to the pixel electrode 150B, and an active pattern 124 formed of amorphous or polycrystalline silicon, through which a conductive channel region is definable between the source and drain electrodes 122 and 123 when a gate voltage is supplied to the gate electrode 121.

Contact holes 140 may be formed through first and second insulation films (not shown) to enable connection between the source electrode 122 and a source region of the active pattern 124 as well as between the drain electrode 123 and a drain region of the active pattern 124.

According to principles of the present invention, the source electrode 122 may include an extended portion that connects with the data line 117. In one aspect of the present invention, the drain electrode 123 may include an extended portion that directly connects with the pixel electrode 150B.

According to principles of the present invention, the gate electrode 121, the gate lines 116 and 116', and the pixel electrode 150B may be simultaneously formed in the same photolithographic masking process. In one aspect of the present invention, the gate electrode 121 and the gate lines 116 and 116' may, for example, include a double-layered structure having first and second conductive films. In another aspect of the present invention, the pixel electrode 150B may, for example, include a single-layered structure having only the first conductive film. In still another aspect of the present invention, the pixel electrode 150B, the gate electrode 121 and the gate lines 116 and 116' may be formed on the same layer.

According to principles of the present invention, the pixel electrode 150B may be completely exposed in a process that forms the contact holes 140 through the second insulation film. In one aspect of the present invention, the pixel electrode 150B may be directly connected with the drain electrode 123 outside a contact hole.

Having described the array substrate according to principles of the first embodiment, a method of fabricating such an array substrate will now be described in greater detail with reference to FIGS. 4A to 4D.

FIGS. 4A to 4D illustrate sectional views of a process of fabricating the array substrate shown in FIG. 3, taken along line III-III'.

Figure 4A:
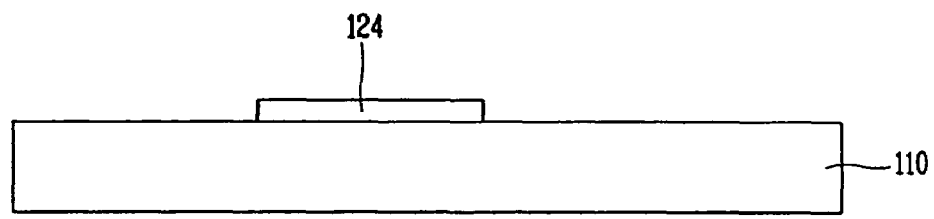
FIGS. 4A to 4D illustrate sectional views of a process of fabricating the array substrate shown in FIG. 3, taken along line III-III'.

Referring to FIG. 4A, a layer of silicon (e.g., amorphous or polycrystalline) may be deposited on the substrate 110 and, in a first photolithographic masking process, be patterned to form an active pattern 124. In one aspect of the present invention, the substrate 110 may, for example, include a transparent, electrically insulative material such as glass.

In one aspect of the present invention, a buffer layer including a material such as silicon dioxide ($SiO_2$) may be formed on the substrate 110 prior to forming the active pattern 124 to prevent impurities (e.g., sodium (Na)) from diffusing from the substrate 110 into subsequently deposited materials.

In one aspect of the present invention, the layer of silicon from which the active pattern 124 is formed may be provided by depositing a layer of amorphous or polycrystalline silicon. In another aspect of the present invention, however, the layer of silicon from which the active pattern 124 is formed may be provided by depositing a layer of amorphous silicon and crystallizing the amorphous silicon layer to form a polycrystalline silicon layer. For example, an amorphous silicon layer may be deposited on the substrate 110 via a deposition method such as low pressure chemical vapor deposition (LPCVD), plasma enhanced chemical vapor deposition (PECVD), or the like. Next, a dehydrogenation process may be performed to suitably eliminate hydrogen atoms from within the amorphous silicon layer. Subsequently, thermal treatment may be carried out in a high temperature furnace or via an examiner laser annealing (ELA) process to induce solid phase crystallization (SPC) within the dehydrogenated amorphous silicon layer. According to principles of the present invention, the ELA process generally involves exposing the amorphous silicon layer to pulses of laser light through a mask designed to induce sequential lateral solidification (SLS) within the exposed amorphous silicon film, wherein the SLS process tends to form grains within the silicon layer that grow laterally. Specifically, portions of the amorphous silicon layer exposed to the pulses of laser light become molten but quickly solidify from the liquid/solid interface toward a center of the exposed area. According to the SLS method, the size of silicon grains that are formed may be controlled by controlling, among other things, the exposure area of the silicon layer and the intensity of the laser light.

Figure 4B:
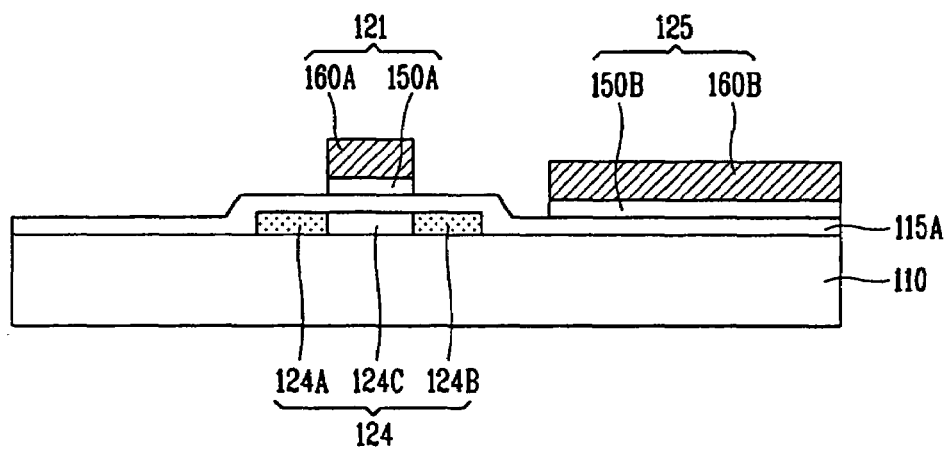

Referring to FIG. 4B, a first insulation film 115A and first and second conductive films 150 and 160, respectively, may be sequentially deposited over the entire surface of the substrate 110 and on the active pattern 124. After being deposited, the first and second conductive films 150 and 160 may be patterned in a second photolithographic masking process to simultaneously form a gate electrode 121, gate lines (not shown), and a pixel electrode pattern 125.

According to principles of the present invention, the gate electrode 121 may, for example, include a first gate electrode pattern 150A and a second gate electrode pattern 160A. In one aspect of the present invention, pixel electrode pattern 125 may, for example, include a first pixel electrode pattern 150B and a second pixel electrode pattern 160B. In another aspect of the present invention, the first gate and pixel electrode patterns 150A and 150B may be formed of the first conductive film 150 and the second gate and pixel electrode patterns 160A and 160B may be formed of the second conductive film 160.

In one aspect of the present invention, the first conductive film 150 may, for example, include a suitably transparent conductive film such as indium tin oxide (ITO), indium zinc oxide (IZO), or the like. In another aspect of the present invention, the second conductive film 160 may, for example, include a suitably opaque conductive film such as aluminum, an aluminum alloy, tungsten, copper, chromium, molybdenum, or the like, or combinations thereof. In still another aspect of the present invention, the second conductive film 160 may, for example, include the same material as the first conductive film 150.

After forming the gate electrode 121 and pixel electrode pattern 125, impurity ions (i.e., dopants) may be implanted into regions of the active pattern 124, using the gate electrode 121 as a mask, to form a source region 124A and a drain region 124B. Thus, the source/drain regions 124A/124B, separated by a channel region 124C, may ohmically contact subsequently formed source/drain electrodes.

Figure 4C:
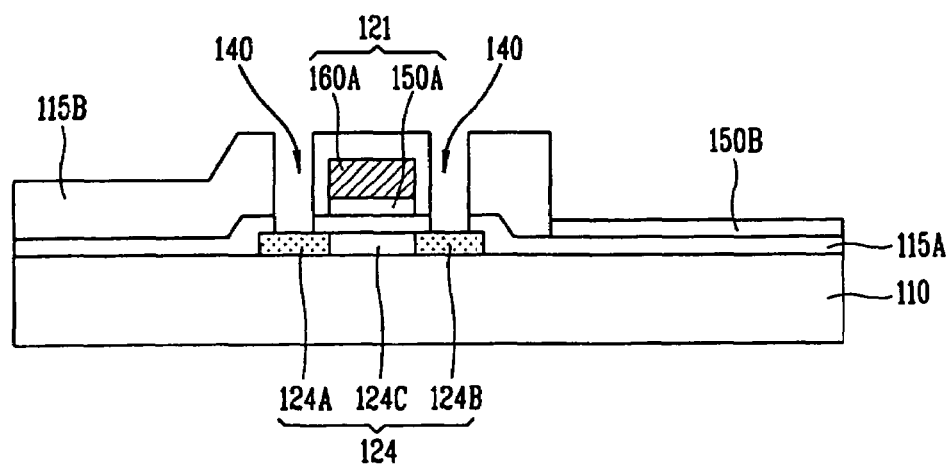

Referring to FIG. 4C, a second insulation film 115B (i.e., an interlayer insulation film) may be deposited over the entire surface of the substrate 110 and on the gate electrode 121, the gate lines 116 and 116', and the pixel electrode pattern 125. After being deposited, the first and second insulation films 115A and 115B may be patterned in a third photolithography masking process to form contact holes 140. In one aspect of the present invention, the contact holes may expose portions of the source/drain regions 124A/124B. In another aspect of the present invention, the third photolithographic masking process may also expose the pixel electrode pattern 125 and selectively remove the second pixel electrode pattern 160B with respect to the first pixel electrode pattern 150B. Provided as described above, the first pixel electrode pattern 150B constitutes a pixel electrode. In still another aspect of the present invention, the pixel electrode 150B may be formed by forming an opening within the second insulation film 115B that is greater than or equal to the area of the pixel electrode 150B.

FIGS. 5A to 5D illustrate sectional views of the aforementioned third photolithographic masking process in accordance with principles of the first embodiment of the present invention.

Figure 5A:
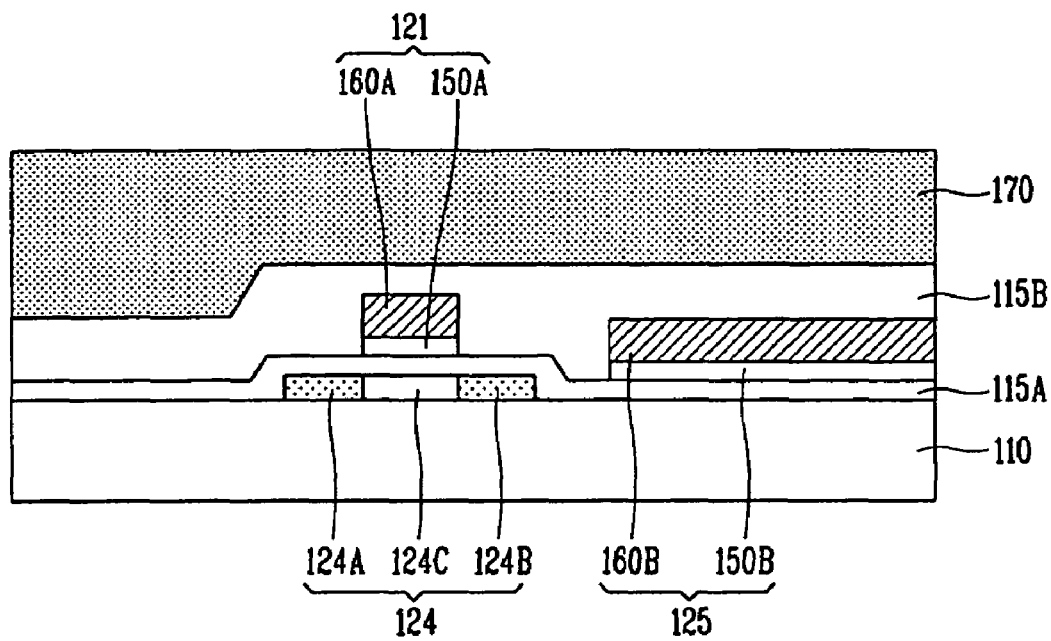
FIGS. 5A to 5D illustrate sectional views of a third photolithographic masking process used in forming a contact hole and opening a pixel electrode region in accordance with principles of the first embodiment of the present invention.
Figure 5B:
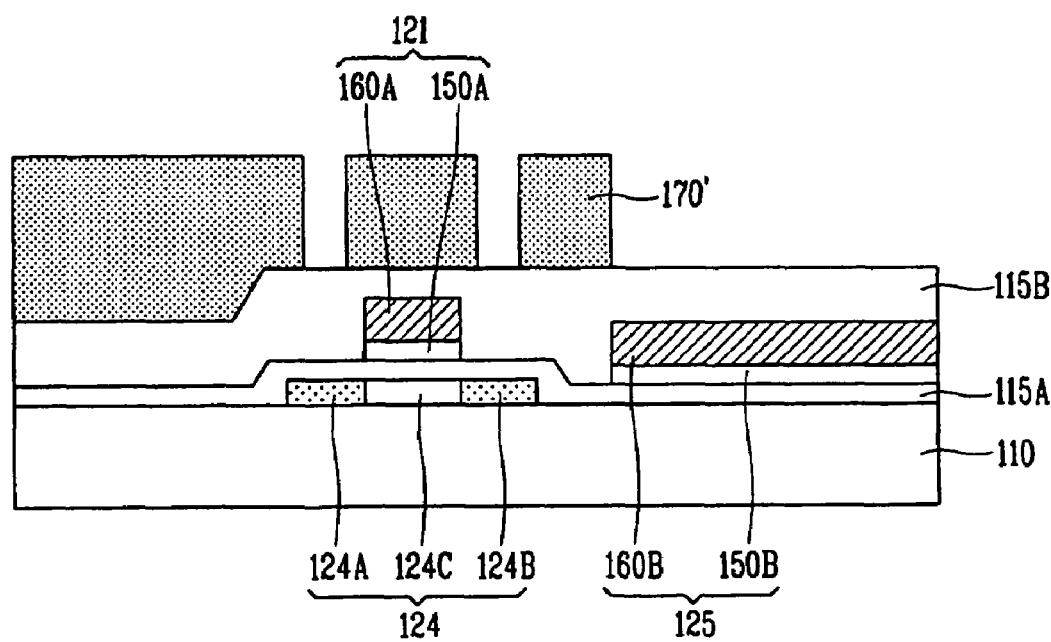

Referring to FIG. 5A, a photosensitive film 170 may formed on the second insulation film 115B and selectively exposed to light via a contact hole mask (not shown). In one aspect of the present invention, the photosensitive film 170 may include a photosensitive material such as photoresist. The photosensitive film 170 may then be developed, thereby forming the photosensitive film pattern 170' shown in FIG. 5B. In one aspect of the present invention, the photosensitive film pattern 170' exposes portions of the second insulating film 115B aligned over the source/drain regions 124A/124B and the pixel electrode pattern 125. In one aspect of the present invention, the portion of the second insulating film 115B that is exposed by the photosensitive film pattern 170' and aligned over the pixel electrode pattern 125 may be greater than or equal to the area of the pixel electrode 150B.

Figure 5C:
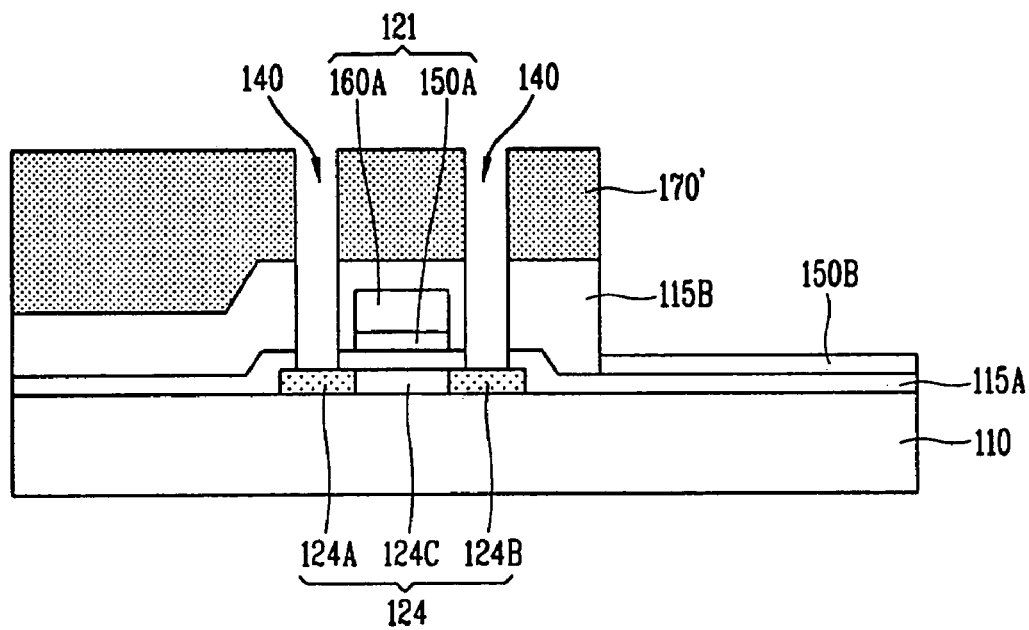
Figure 5D:
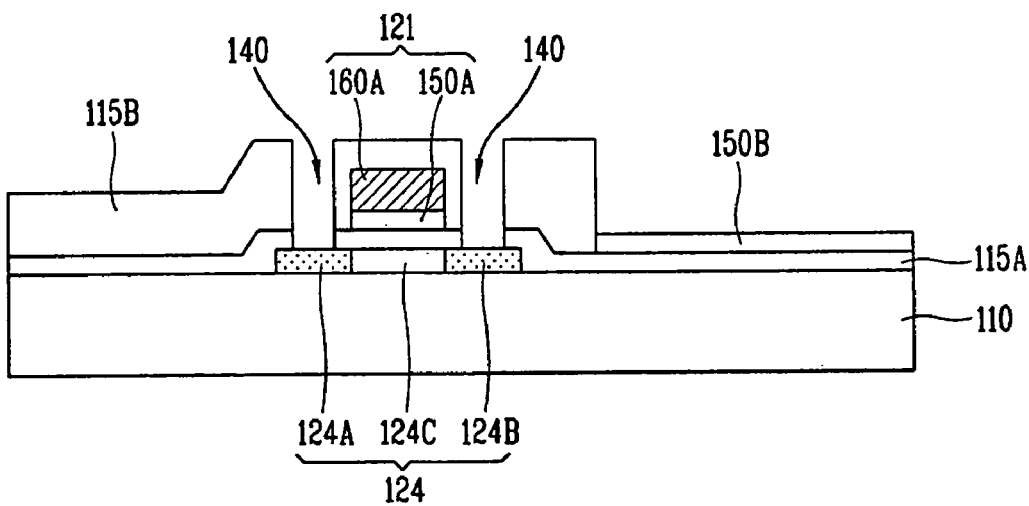

Next, and with reference to FIG. 5C, the first and second insulation films 115A and 115B may be selectively removed using the photosensitive film pattern 170' as a mask to simultaneously form contact holes 140 that expose portions of the source/drain regions 124A/124B and an opening that exposes the second pixel electrode pattern 160B. Subsequently, the exposed second pixel electrode pattern 160B is removed in an etching process using the photosensitive film pattern 170' as a mask, thereby exposing the first pixel electrode pattern 150B. Provided as described above, the first pixel electrode pattern 150B constitutes a pixel electrode. After forming the contact holes 140 and the pixel electrode 150B, the photosensitive film pattern 170' may be removed as shown in FIG. 5D.

Figure 4D:
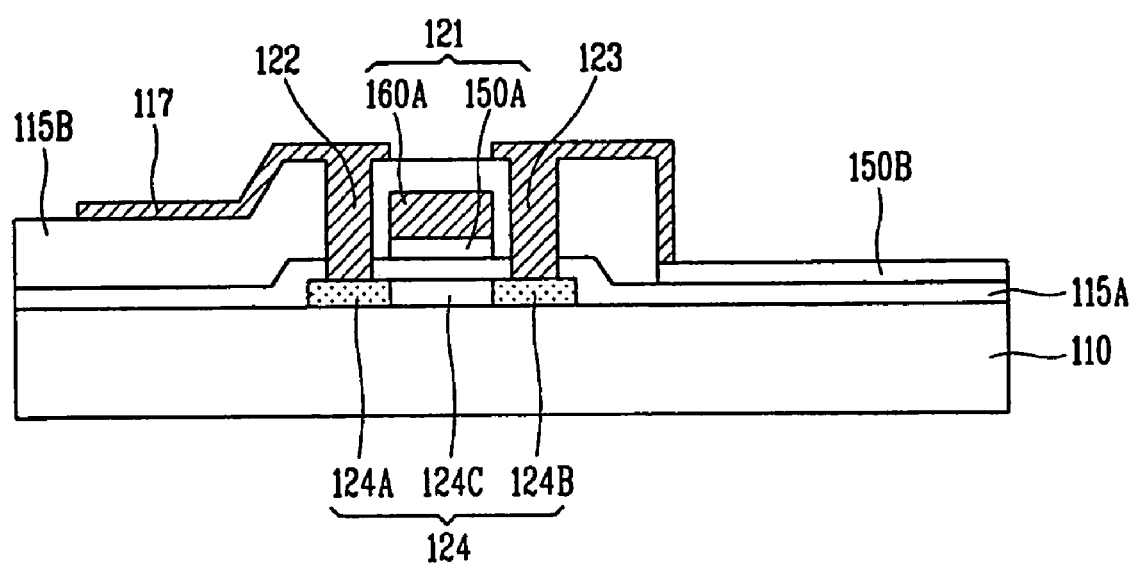

Referring now to FIG. 4D, a third conductive film may be deposited over the structure discussed above with respect to FIG. 5D and then patterned in a fourth photolithographic masking process to simultaneously form source and drain electrodes 122 and 123, respectively. In one aspect of the present invention, the source and drain electrodes 122 and 123 may be electrically connected to the source and drain regions 124A/124B via respective contact holes 140. In another aspect of the present invention, a portion of the third conductive film may be patterned so as to extend from the source electrode 122 to form the data line 117. In still another aspect of the present invention, a portion of the third conductive film may be patterned so as to extend from the drain electrode 123 to directly contact the pixel electrode 150B.

As described above, the drain and pixel electrodes 123 and 150B may be directly connected to each other without the need of forming a contact hole through a third insulating film formed over the drain electrode 123. Thus, the array substrate according to principles of the first embodiment of the present invention may be fabricated using a reduced number of photolithographic masking processes. Further, and as also described above, the gate electrode, the gate lines, and the pixel electrode can be simultaneously formed. Thus, the array substrate according to principles of the first embodiment of the present invention may be fabricated using a further reduced number of photolithographic masking processes. By reducing the number of photolithographic masking processes required to fabricate the array substrate, the entire fabrication process can be simplified, the processing yield can be increased, and the fabrication cost can be reduced.

Figure 6:
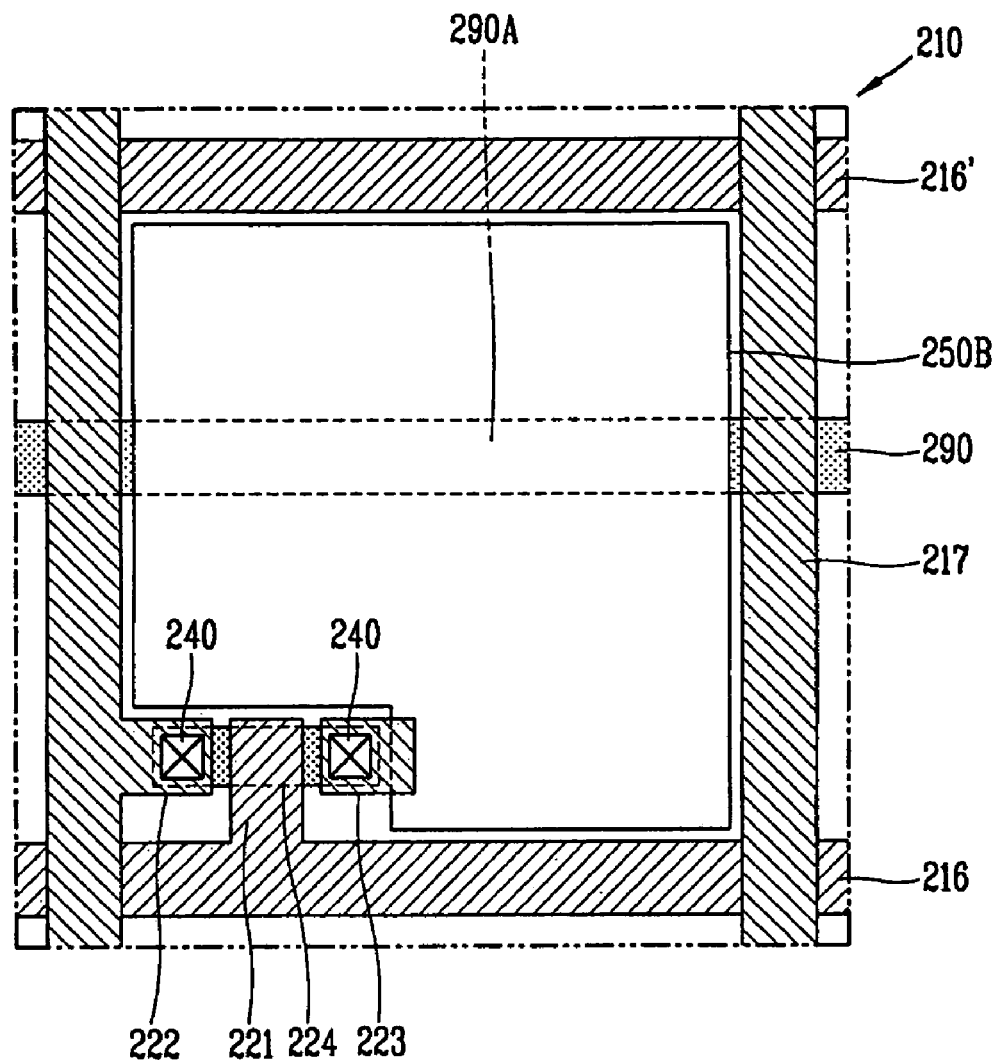
FIG. 6 illustrates a partial plan view of an array substrate according to principles of a second embodiment of the present invention.

FIG. 6 illustrates a partial plan view of an array substrate according to principles of a second embodiment of the present invention.

Referring generally to FIG. 6, the principles of the second embodiment of the present invention may exemplarily provide an array substrate identical to the array substrate of the first embodiment but further including a storage-on-common (SOC) structure, wherein a storage capacitor is formed within the pixel region using a storage line. Thus, and with the exception of the storage capacitor, the array substrate of the second embodiment may be fabricated identically to the array substrate of the first embodiment.

The array substrate 210 according to principles of the second embodiment of the present invention may, for example, support horizontally oriented gate lines 216 and 216' and vertically oriented data lines 217 defining a pixel region. According to principles of the present invention, and with respect to a particular pixel, reference numeral 216 designates the gate line that is connected to a corresponding TFT while reference numeral 216' designates a gate line that merely defines an edge of the pixel region. A switching device such as a TFT may be formed at the crossing of a gate line 216 and a corresponding data line 217 and a pixel electrode 250B may be formed within each pixel region and connected to a TFT. Constructed as described above, a subsequently provided layer of liquid crystal material may be driven using the pixel electrode 250B in conjunction with a common electrode (not shown) of a color filter substrate (also not shown).

Each TFT may, for example, include a gate electrode 221 connected to the gate line 216, a source electrode 222 connected to the data line 217, a drain electrode 223 connected to the pixel electrode 250B, and an active pattern 224 formed of amorphous or polycrystalline silicon through which a conductive channel region is definable between the source and drain electrodes 222 and 223 when a gate voltage is supplied to the gate electrode 221.

According to principles of the present invention, a storage line 290 may be formed parallel to the gate line 216 and be disposed within the pixel region. In one aspect of the present invention, the portion of the storage line 290 within the pixel region may constitute a storage electrode 290A that, with the overlapping pixel electrode 250B, forms a storage capacitor. In another aspect of the present invention, the storage line 290 (and thus the storage electrode 290A) may be formed from the same silicon layer from which the active pattern 224 is formed. In still another aspect of the present invention, the storage line 290 (and thus the storage electrode 290A) may be formed by depositing an undoped silicon layer.

Figure 7:
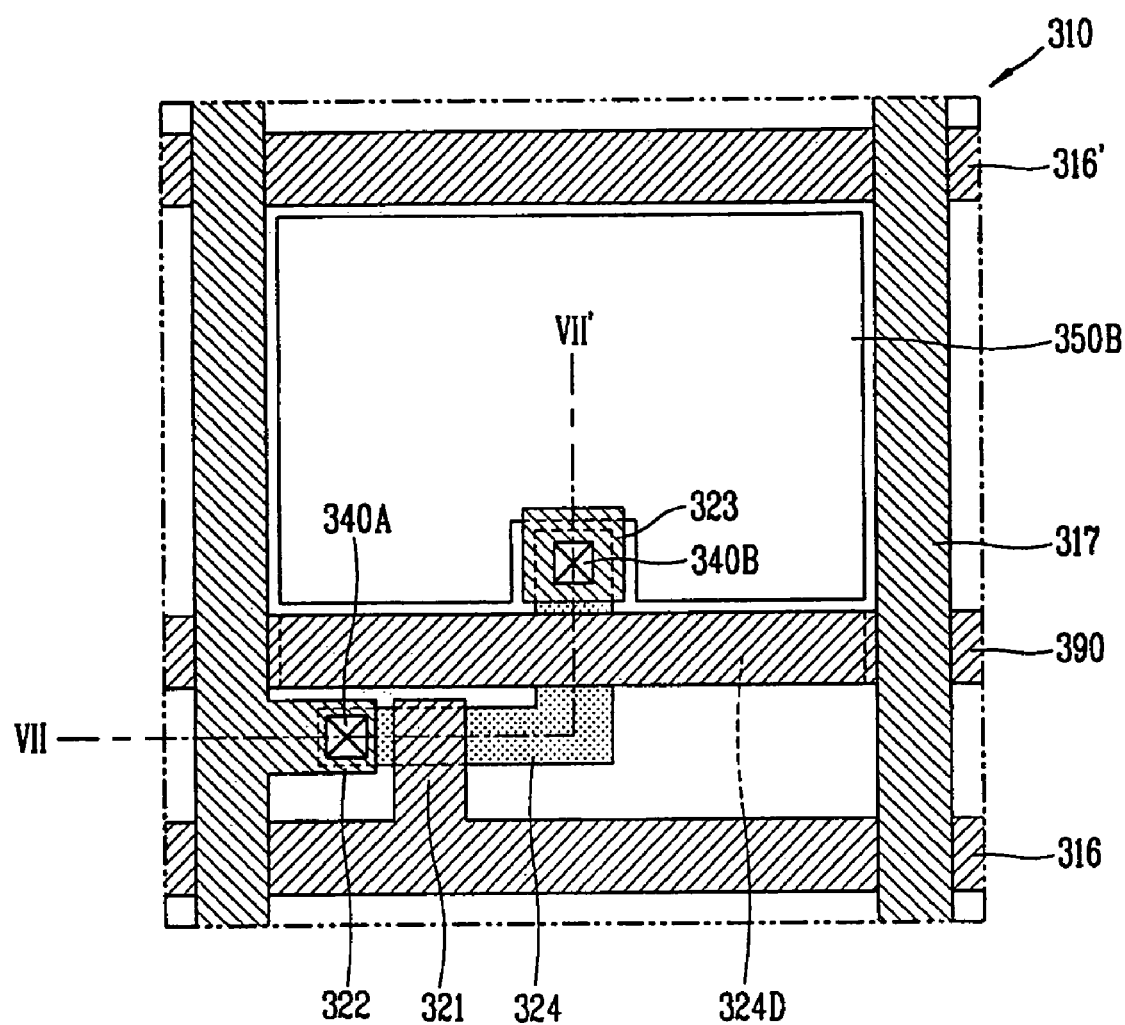
FIG. 7 illustrates a partial plan view of an array substrate according to principles of a third embodiment of the present invention.

FIG. 7 illustrates a partial plan view of an array substrate according to principles of a third embodiment of the present invention.

Referring to FIG. 7, the array substrate 310 according to principles of the third embodiment of the present invention may, for example, support horizontally oriented gate lines 316 and 316' and vertically oriented data lines 317 defining a pixel region. According to principles of the present invention, and with respect to a particular pixel, reference numeral 316 designates the gate line that is connected to a corresponding TFT while reference numeral 316' designates a gate line that merely defines an edge of the pixel region. A switching device such as a TFT may be formed at the crossing of a gate line 316 and a corresponding data line 317 and a pixel electrode 350B may be formed within each pixel region. In one aspect of the present invention, each pixel electrode 350B may be connected with a corresponding TFT and, in concert with a common electrode, may drive a layer of liquid crystal provided within the pixel region. According to principles of the present invention, a storage line 390 may be formed elevationally between the gate lines 316 and a lower surface of the pixel electrode 350B.

Each TFT may, for example, include a gate electrode 321 connected to the gate line 316, a source electrode 322 connected to the data line 317, a drain electrode 323 connected to the pixel electrode 350B, and an active pattern 324 formed of amorphous or polycrystalline silicon, through which a conductive channel region is definable between the source and drain electrodes 322 and 323 when a gate voltage is supplied to the gate electrode 321.

First and second contact holes 340A and 340B may be formed through first and second insulation films (not shown) to enable respective connections between the source electrode 322 and a source region of the active pattern 324 and between the drain electrode 323 and a drain region of the active pattern 324.

According to principles of the present invention, the drain region of the active pattern 324 may be disposed within pixel region electrically contact the pixel electrode 350B via the second contact hole 340B therein. In one aspect of the present invention, a storage region 324D may be formed between source and drain regions of the active pattern 324. In another aspect of the present invention, the storage region 324D may extend parallel to the gate line 316 and be overlapped by the storage line 390 to form a storage capacitor. In still another aspect of the present invention, the first insulation film may be provided between the storage line 390 and the storage region 324D of the active pattern 324.

According to principles of the present invention, the gate electrode 321, the gate lines 316 and 316', the storage line 390, and the pixel electrode 350B may be simultaneously formed in the same photolithographic masking process. In one aspect of the present invention, the gate electrode 321, the gate lines 316 and 316', and the storage line 390 may, for example, include a double-layered structure having first and second conductive films. In another aspect of the present invention, the pixel electrode 350B may, for example, include a single-layered structure having only the first conductive film. In still another aspect of the present invention, the pixel electrode 350B, the gate electrode 321, the gate lines 316 and 316', and the storage line 390 may be formed on the same layer.

Having described the array substrate according to principles of the third embodiment, a method of fabricating such an array substrate will now be described in greater detail with reference to FIGS. 8A to 8H and FIGS. 9A to 9D.

FIGS. 8A to 8H illustrate sectional views of a process of fabricating the array substrate shown in FIG. 7, taken along line VII-VII'. FIGS. 9A to 9D illustrate plan views of a process of fabricating an array substrate in accordance with principles of the third embodiment of the present invention.

Figure 8A:
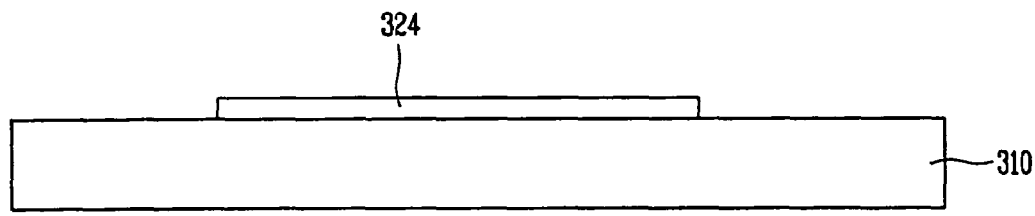
FIGS. 8A to 8H illustrate sectional views of a process of fabricating the array substrate shown in FIG. 7, taken along line VII-VII'.
Figure 9A:
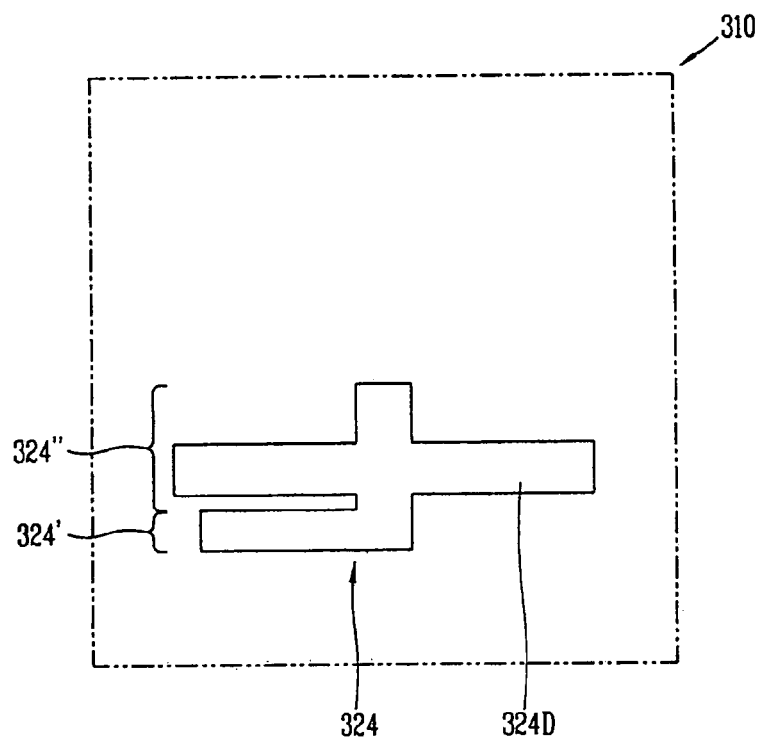
FIGS. 9A to 9D illustrate plan views of a process of fabricating an array substrate in accordance with principles of the third embodiment of the present invention.

Referring to FIGS. 8A and 9A, a layer of silicon (e.g., amorphous or polycrystalline) may be deposited on the substrate 310 and, in a first photolithographic masking process, be patterned to form an active pattern 324. In one aspect of the present invention, the substrate 310 may, for example, include a transparent, electrically insulative material such as glass.

According to principles of the present invention, the active pattern 324 may, for example, include first and second portions 324' and 324", respectively. In one aspect of the present invention, the first and second portions 324' and 324" may intersect each other. In one aspect of the present invention, the first portion 324' may, for example, include a rectangular channel region extending toward the pixel region. In one aspect of the present invention, the second portion 324" may include the storage region 324D. It will be appreciated, however, that the principles of the present invention may be realized by any other suitable configuration of active pattern 324 that is overlapped by a subsequently provided storage line.

Figure 8B:
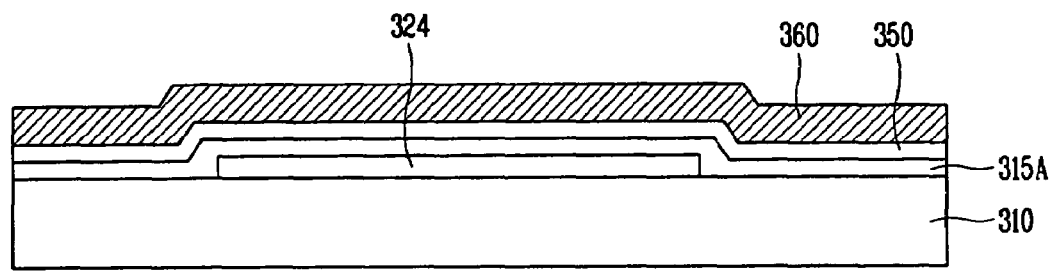

Referring to FIG. 8B, a first insulation film 315A (i.e., a gate insulation film) and first and second conductive films 350 and 360 may be sequentially deposited over the entire surface of the substrate 310 and on the active pattern 324.

In one aspect of the present invention, the first conductive film 350 may, for example, include a suitably transparent conductive film such as indium tin oxide (ITO), indium zinc oxide (IZO), or the like. In another aspect of the present invention, the second conductive film 360 may, for example, include a suitably opaque conductive film such as aluminum, an aluminum alloy, tungsten, copper, chromium, molybdenum, or the like, or combinations thereof. In still another aspect of the present invention, the second conductive film 360 may, for example, include the same material as the first conductive film 350.

Figure 8C:
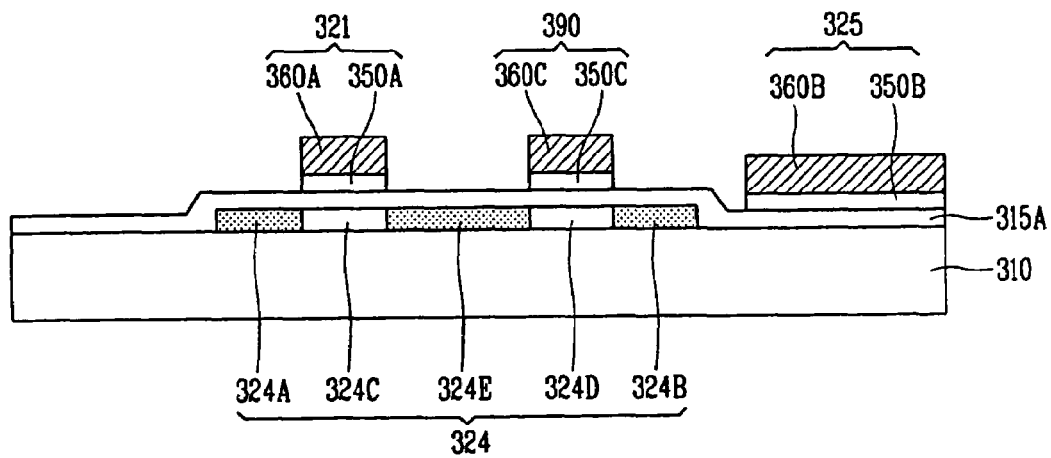
Figure 9B:
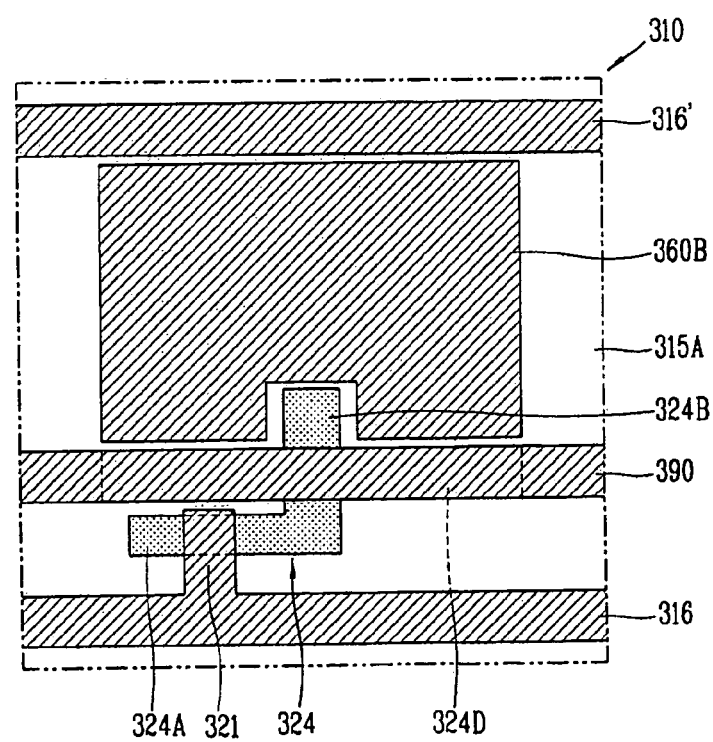

Subsequently, and with reference to FIGS. 8C and 9B, the first and second conductive films may be patterned in a second photolithographic masking process to simultaneously for a gate electrode 321, gate lines 316 and 316', a storage line 390, and a pixel electrode pattern 322. According to principles of the present invention, the storage line 390 may overlap the storage region 324D of the active pattern 324 to form a storage capacitor, wherein the with the first insulation film 315A disposed therebetween.

According to principles of the present invention, the gate electrode 121 and storage line 390 may, for example, include first gate electrode and storage line patterns 350A and 350C, respectively, and second gate electrode and storage line patterns 360A and 360C. In one aspect of the present invention, pixel electrode pattern 325 may, for example, include first and second pixel electrode patterns 350B and 360B, respectively. In another aspect of the present invention, the first gate electrode, pixel electrode, and storage line patterns 350A, 350B, and 350C, respectively, may be formed of the aforementioned first conductive film and the second gate electrode, pixel electrode, and storage line patterns 360A, 360B, and 360C, respectively, may be formed of the aforementioned second conductive film.

After forming the gate electrode 321, the storage line 390, and the pixel electrode pattern 325, impurity ions may be implanted into regions of the active pattern 324, using the gate electrode 321 and storage line 390 as a mask, to form a source region 324A and a drain region 324B. Thus, the source region 324A and the drain region 324B, separated by channel, connection, and storage regions 324C, 324E, and 324D, respectively, may ohmically contact subsequently formed source/drain electrodes. After impurity ions have been implanted, the impurities may be activated in an activation process.

According to principles of the present invention, electrical characteristics of the active pattern 324 may be altered according to the type of impurity (i.e., dopant) is implanted. For example, if the implanted impurity is a Group III element such as boron (B), the source/drain regions 324A and 324B are formed as p+ type regions and the TFT is, therefore, a P-type TFT. Alternately, if the implanted impurity is a Group V element such as phosphorous (P), the source/drain regions 324A and 324B are formed as n+ type regions and the TFT is, therefore, an N-type TFT.

Figure 8D:
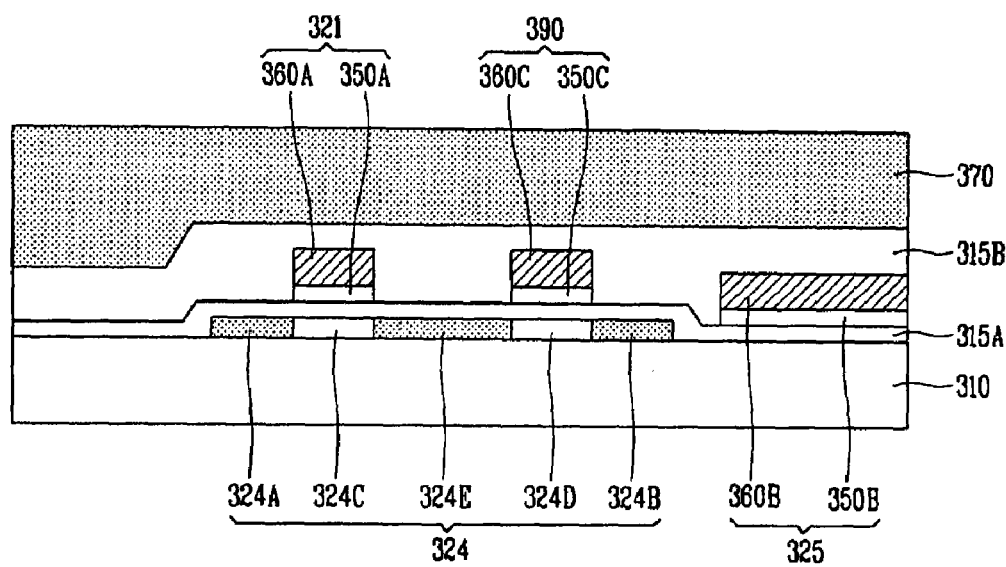
Figure 8E:
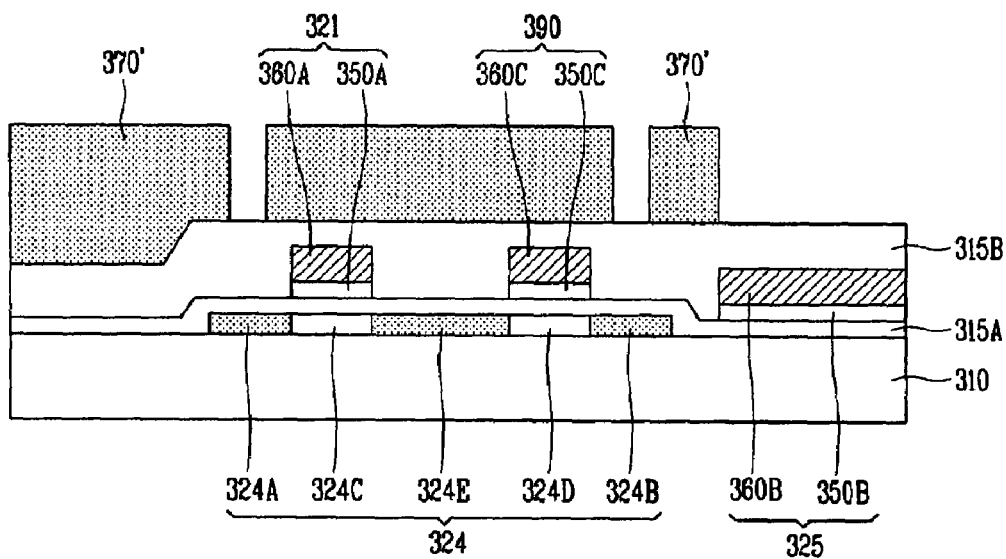

Referring to FIG. 8D, a second insulation film 315B (i.e., an interlayer insulation film) may be deposited over the entire surface of the substrate 310 and on the gate electrode 321, the gate lines 316 and 316', the storage line 390, and the pixel electrode pattern 325. In one aspect of the present invention, the second insulation film 315B may include an interlayer insulation film. In one aspect of the present invention, the second insulation film 315B may include a transparent organic insulation material such as benzocyclobutene (BCB), an acrylic resin, or the like.

Subsequently, the first and second insulation films 315A and 315B may be patterned in a third photolithography masking process to form the first and second contact holes 340A and 340B, respectively. In one aspect of the present invention, the first and second contact holes 340A and 340B may expose portions of the respective source/drain regions 324A/324B. In another aspect of the present invention, the third photolithographic masking process may also expose the pixel electrode pattern 325 and selectively remove the second pixel electrode pattern 360B with respect to the first electrode pattern 350B.

According to principles of the present invention, the third photolithographic masking process may be performed by forming a photosensitive film 370 on the second insulation film 315B and selectively exposing the photosensitive film 370 to light via a contact hole mask (not shown). In one aspect of the present invention, the photosensitive film 370 may include a photosensitive material such as photoresist. The photosensitive film 370 may then be developed, thereby forming the photosensitive film pattern 370' shown in FIG. 8E. In one aspect of the present invention, the photosensitive film pattern 370' exposes portions of the second insulating film 315B aligned over the source/drain regions 324A/324B and the pixel electrode pattern 325. In one aspect of the present invention, the portion of the second insulating film 315B that is exposed by the photosensitive film pattern 370' and aligned over the pixel electrode pattern 325 may be greater than or equal to the area of the pixel electrode 350B.

Figure 8F:
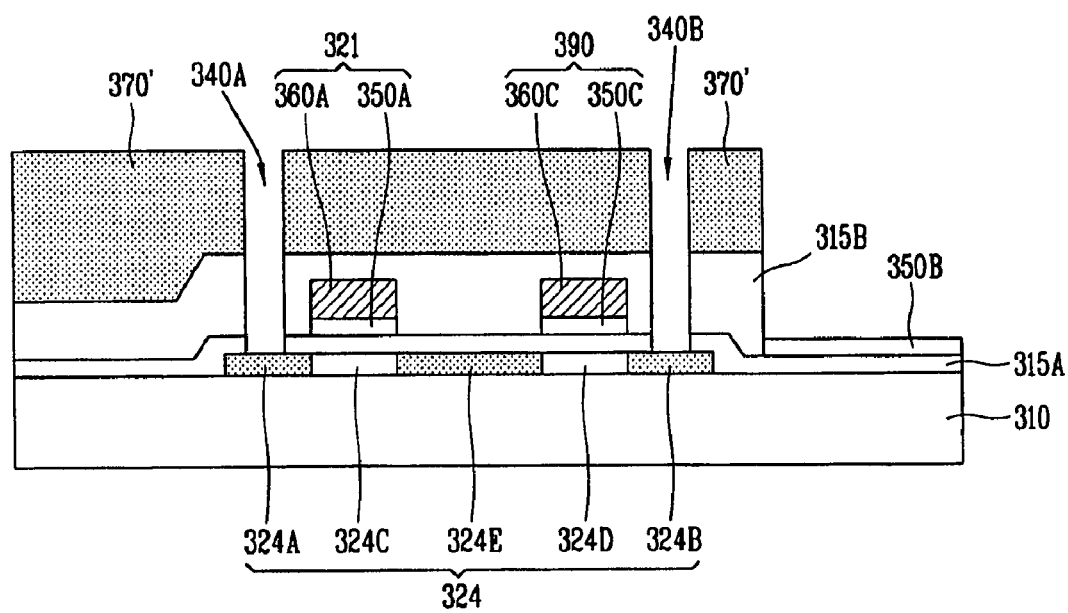
Figure 8G:
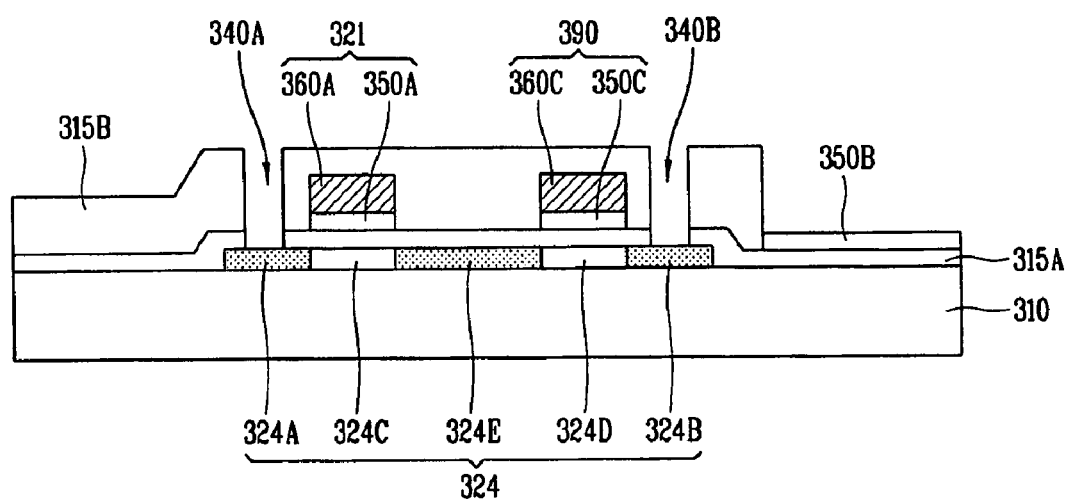
Figure 9C:
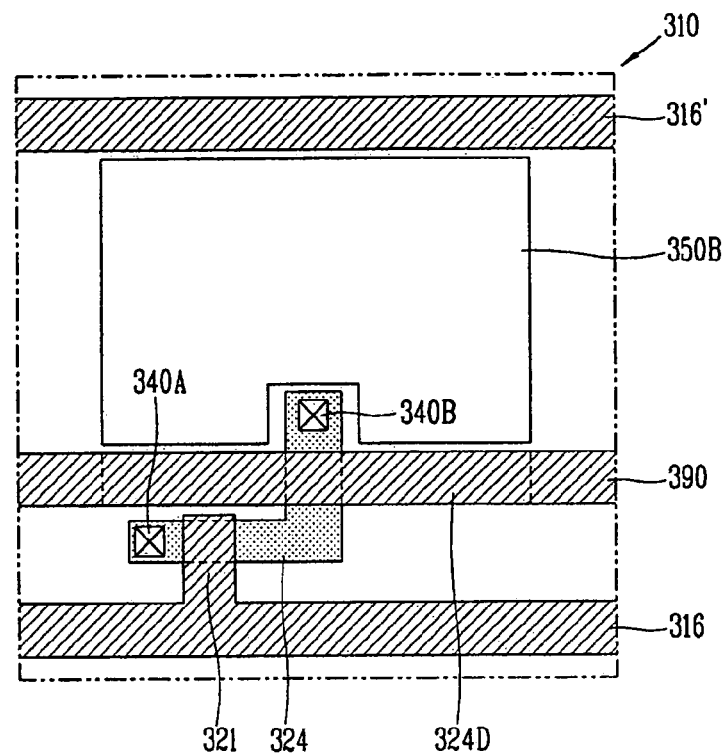

Next, and with reference to FIG. 8F, the first and second insulation films 315A and 315B may be selectively removed using the photosensitive film pattern 370' as a mask to simultaneously form first and second contact holes 340A and 340B that expose portions of the source/drain regions 324A/324B and an opening that exposes the second pixel electrode pattern 360B. Subsequently, the exposed second pixel electrode pattern 360B is removed in an etching process using the photosensitive film pattern 370' as a mask, thereby exposing the first pixel electrode pattern 350B. Provided as described above, the first pixel electrode pattern 350B constitutes a pixel electrode. After forming the first and second contact holes 340A and 340B and the pixel electrode 350B, the photosensitive film pattern 370' may be removed as shown in FIGS. 8G and 9C.

Figure 8H:
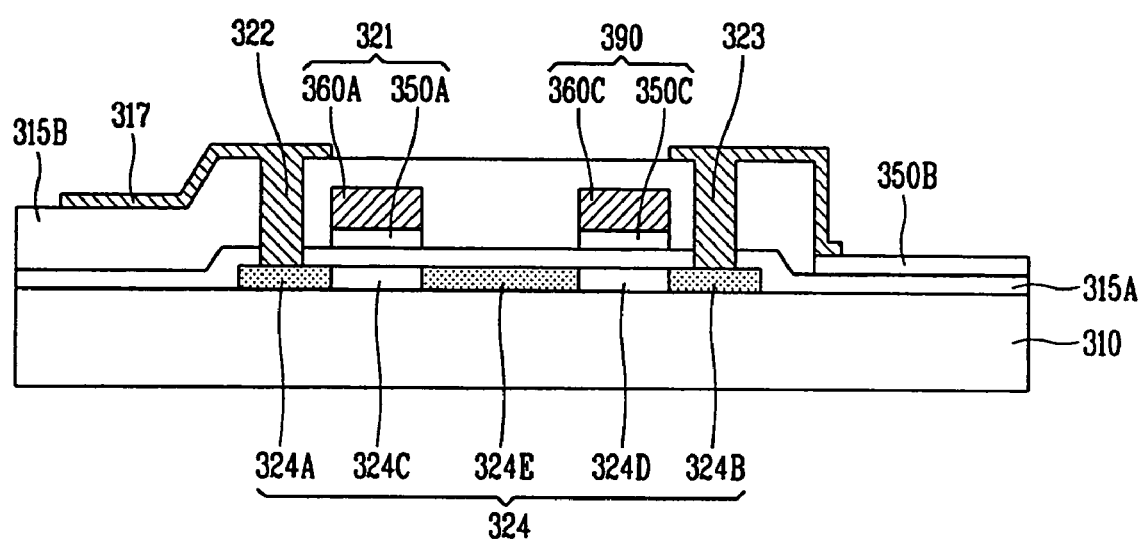
Figure 9D:
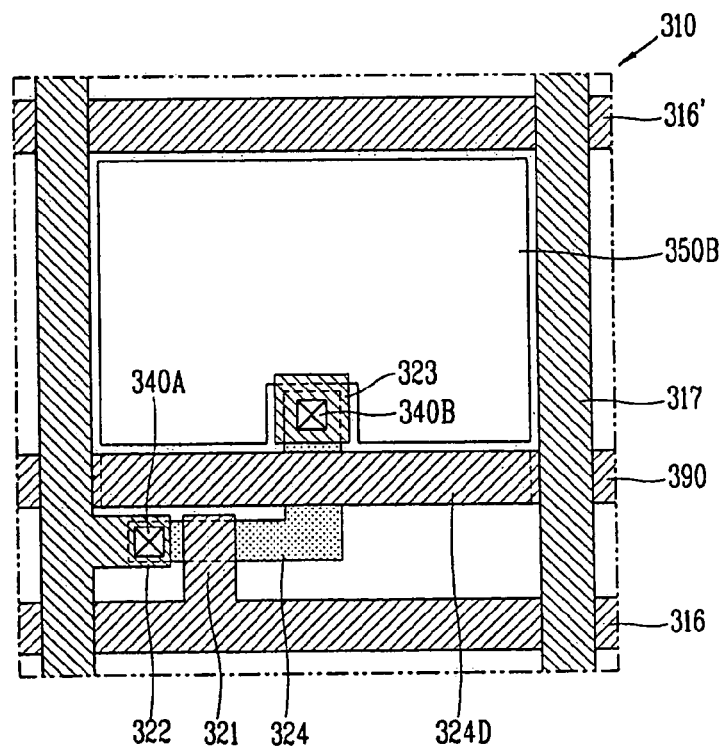

Referring now to FIGS. 8H and 9D, a third conductive film may be deposited over the structure discussed above with respect to FIG. 8G and then patterned in a fourth photolithographic masking process to simultaneously form the source and drain electrodes 322 and 323, respectively. In one aspect of the present invention, the source and drain electrodes 322 and 323 may be electrically connected to respective ones of the source and drain regions 324A/324B via the first and second contact holes 340A and 340B, respectively. In another aspect of the present invention, a portion of the third conductive film may be patterned so as to extend from the source electrode 322 to form the data line 317. In still another aspect of the present invention, a portion of the third conductive film may be patterned so as to extend from the drain electrode 323 to directly contact the pixel electrode 350B.

After formation of any of the array substrates discussed above with respect to the first to third embodiments is complete, they may be bonded to a color filter substrate. Moreover liquid crystal material may be provided between the bonded array and color filter substrates to thereby complete fabrication of an LCD device.

As described above, the drain and pixel electrodes 323 and 350B may be directly connected to each other without the need of forming a contact hole through a third insulating film formed over the drain electrode 323. Thus, the array substrate according to principles of the third embodiment of the present invention may be fabricated using a reduced number of photolithographic masking processes. Further, and as also described above, the gate electrode, the gate lines, and the pixel electrode can be simultaneously formed. Thus, the array substrate according to principles of the first embodiment of the present invention may be fabricated using a further reduced number of photolithographic masking processes. Still further, the storage line may be simultaneously formed with the gate electrode, the gate lines, and the pixel electrode, thereby further reducing the number of photolithographic masking processes required to fabricate an array substrate having an SOC structure that prevents the degradation of picture quality due to resistance in the storage line. By reducing the number of photolithographic masking processes required to fabricate the array substrate, the entire fabrication process can be simplified, the processing yield can be increased, and the fabrication cost can be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a liquid crystal display device, comprising:
    forming an active layer on a first substrate, wherein the active layer includes a source region, a drain region, a channel region, and a storage region;
    forming a first insulation layer on the first substrate;
    forming a first and second conductive layers on the first substrate;
    forming a gate electrode, a gate line, a pixel electrode, and a storage line on the first substrate by patterning the first and second conductive layers, wherein storage line overlaps the storage region;
    forming a second insulation layer on the first substrate;
    forming first and second contact holes through the first and second insulation layers, wherein the first and second contact holes expose respective ones of the source and drain regions;
    opening the pixel electrode by removing the second insulation layer and a portion of the second conductive layer on the pixel electrode, wherein the gate electrode, the gate line, and the storage line include the first and second conductive layers, and wherein the pixel electrode includes the first conductive layer; and
    forming a source electrode electrically connected to the source region through the first contact hole and a drain electrode electrically connected to the drain region through the second contact hole.

2. The method of claim 1, wherein the active layer includes silicon.

3. The method of claim 2, wherein the active layer includes polycrystalline silicon.

4. The method of claim 1, wherein at least one of the first and second conductive layers includes a transparent conductive material.

5. The method of claim 4, wherein the transparent conductive material includes at least one of indium tin oxide (ITO) and indium zinc oxide (IZO).

6. The method of claim 1, wherein the second conductive layer includes an opaque conductive material.

7. The method of claim 6, wherein the opaque conductive material includes at least one of aluminum, aluminum alloy, tungsten, copper, chromium, and molybdenum.

8. The method of claim 1, wherein forming the first and second contact holes and opening the pixel electrode are substantially simultaneously preceded.

9. The method of claim 8, wherein an area of the opened the pixel electrode is greater than or equal to the area of the pixel electrode.

10. The method of claim 9, wherein the second insulation layer is patterned as the structure of the pixel electrode.

11. The method of claim 1, wherein the storage region is between the gate line and the pixel electrode.

12. The method of claim 1, wherein the storage region is parallel to the gate line.

13. The method of claim 1, wherein the storage line partially overlaps the storage region.

14. The method of claim 1, wherein the storage line is on the storage region and the first insulation layer is between the storage line and the storage region.

15. The method of claim 1, further comprising implanting impurity ions into the active layer after forming the gate electrode and storage line to form the source and drain regions.

16. The method of claim 15, wherein the impurity ions include at least one of a Group III and a Group V element.

17. The method of claim 16, wherein the Group III element includes boron (B) and the Group V element includes phosphorous (P).

18. The method of claim 1, wherein the source and drain regions include at least one of a p+ region and a n+ region.

19. The method of claim 1, wherein forming the gate electrode, the gate line, the pixel electrode, and the storage line are substantially simultaneously preceded.

20. The method of claim 1, wherein forming the gate line and the storage line are substantially simultaneously preceded.

21. The method of claim 1, wherein forming the first and second contact holes and removing the second insulation layer on the pixel electrode are substantially simultaneously preceded.

* * * * *